(12) United States Patent
Kaneda et al.

(10) Patent No.: US 11,450,658 B2
(45) Date of Patent: Sep. 20, 2022

(54) SEMICONDUCTOR APPARATUS AND MANUFACTURING METHOD

(71) Applicant: Canon Kabushiki Kaisha, Tokyo (JP)

(72) Inventors: Tasuku Kaneda, Kanagawa (JP); Hideshi Kuwabara, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 17/323,346

(22) Filed: May 18, 2021

(65) Prior Publication Data
US 2021/0366900 A1 Nov. 25, 2021

(30) Foreign Application Priority Data
May 19, 2020 (JP) .............................. JP2020-087606

(51) Int. Cl.
*H01L 27/06* (2006.01)
*H01L 27/092* (2006.01)
*H01L 21/265* (2006.01)
*H01L 21/8238* (2006.01)

(52) U.S. Cl.
CPC .... *H01L 27/0623* (2013.01); *H01L 21/26513* (2013.01)

(58) Field of Classification Search
CPC .......... H01L 27/0623; H01L 21/26513; H01L 27/0826; H01L 27/0922; H01L 21/823892; H01L 27/0928
See application file for complete search history.

(56) References Cited

U.S. PATENT DOCUMENTS

| | | |
|---|---|---|
| 2005/0179472 A1 | 8/2005 | Nakamura et al. |
| 2006/0141714 A1* | 6/2006 | Lee ............... H01L 21/823814 257/E21.639 |
| 2009/0032869 A1 | 2/2009 | Matsudai et al. |
| 2014/0306319 A1 | 10/2014 | Torii |
| 2015/0162323 A1 | 6/2015 | Taya et al. |

FOREIGN PATENT DOCUMENTS

| | | |
|---|---|---|
| JP | 2000286417 A | 10/2000 |
| JP | 2003068873 | 3/2003 |

* cited by examiner

*Primary Examiner* — David Vu
(74) *Attorney, Agent, or Firm* — Venable LLP

(57) ABSTRACT

A semiconductor apparatus comprises a first semiconductor region including a first surface and a second surface, in which a semiconductor of a first conductivity type is arranged, a second semiconductor region of the first conductivity type, which is arranged between the first surface and the second surface, a third semiconductor region of a second conductivity type, which is arranged in a region between the second semiconductor region and the second surface and on a side portion of the second semiconductor region, a fourth semiconductor region of the first conductivity type, which is arranged between the first surface and the second surface; and a fifth semiconductor region of the second conductivity type, which is arranged in a region between the fourth semiconductor region and the second surface and on a side portion of the fourth semiconductor region.

15 Claims, 13 Drawing Sheets

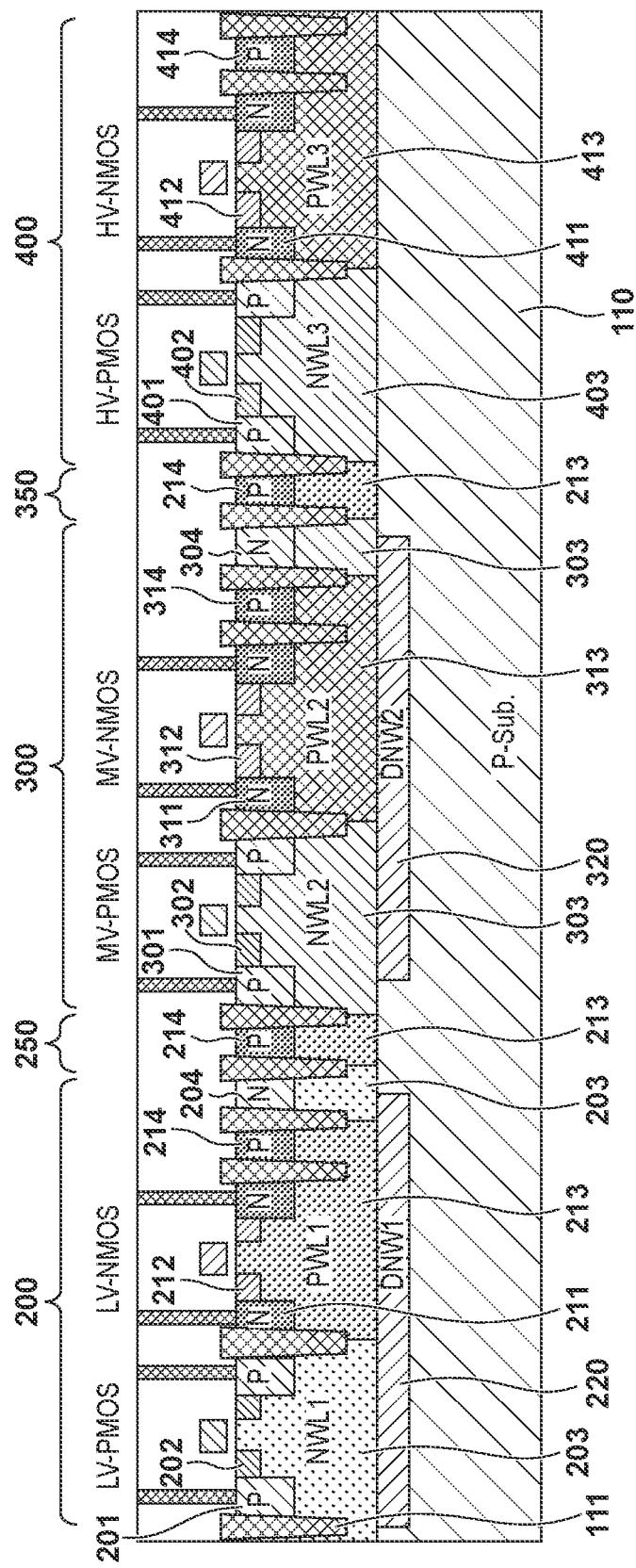

SEMICONDUCTOR APPARATUS AND MANUFACTURING METHOD

BACKGROUND OF THE INVENTION

Field of the Invention

The present invention relates to a semiconductor apparatus having a triple well structure and a method of manufacturing the same.

Description of the Related Art

Semiconductor apparatuses having a triple well structure have been widely used. For example, if the conductivity type of a substrate is a p-type, an n-type well that is of a conductivity type different from that of the substrate is provided between the substrate and a p-type well that is of the same conductivity type as the substrate. This makes it possible to electrically isolate the p-type substrate and the p-type well from each other, independently set the operation voltage of a transistor formed in the p-type well, and improve the degree of freedom in circuit design.

Japanese Patent Laid-Open No. 2003-68873 describes a manufacturing method of forming transistors that operate at different voltages by employing a triple well structure. In Japanese Patent Laid-Open No. 2003-68873, the p-type well of a low-voltage operation transistor is formed in a region of an n-type well where the impurity concentration is low, and the p-type well of a high-voltage operation transistor is formed in a region of the n-type well where the impurity concentration is high.

When the triple well structure is employed, elements such as transistors that operate at a plurality of different voltages can be mounted in a mixed manner on the same substrate. Various voltages can be applied to a semiconductor region where transistors configured to operate at a plurality of voltages are arranged. At this time, if a high reverse bias voltage is applied to a portion serving as a p-n junction, a depletion layer extends, and a leakage current may be generated. Generation of the leakage current may cause an increase in power consumption.

SUMMARY OF THE INVENTION

Accordingly, the present invention is conceived as a response to the above-described disadvantages of the conventional art.

According to one aspect of the present invention, there is provided a semiconductor apparatus comprising, a first semiconductor region including a first surface and a second surface, in which a semiconductor of a first conductivity type is arranged, a second semiconductor region of the first conductivity type, which is arranged between the first surface and the second surface, a third semiconductor region of a second conductivity type, which is arranged in a region between the second semiconductor region and the second surface and on a side portion of the second semiconductor region, a fourth semiconductor region of the first conductivity type, which is arranged between the first surface and the second surface, and a fifth semiconductor region of the second conductivity type, which is arranged in a region between the fourth semiconductor region and the second surface and on a side portion of the fourth semiconductor region, wherein the third semiconductor region and the fifth semiconductor region are separated, and a net impurity concentration of the first conductivity type in each of the second semiconductor region and the fourth semiconductor region is lower than a net impurity concentration of the second conductivity type in each of a region of the third semiconductor region between the second semiconductor region and the second surface and a region of the fifth semiconductor region between the fourth semiconductor region and the second surface.

Further features of the present invention will become apparent from the following description of exemplary embodiments with reference to the attached drawings.

BRIEF DESCRIPTION OF THE DRAWINGS

FIGS. 12A to 12G are views for explaining a manufacturing method of the semiconductor apparatus.

DESCRIPTION OF THE EMBODIMENTS

Figure 1:
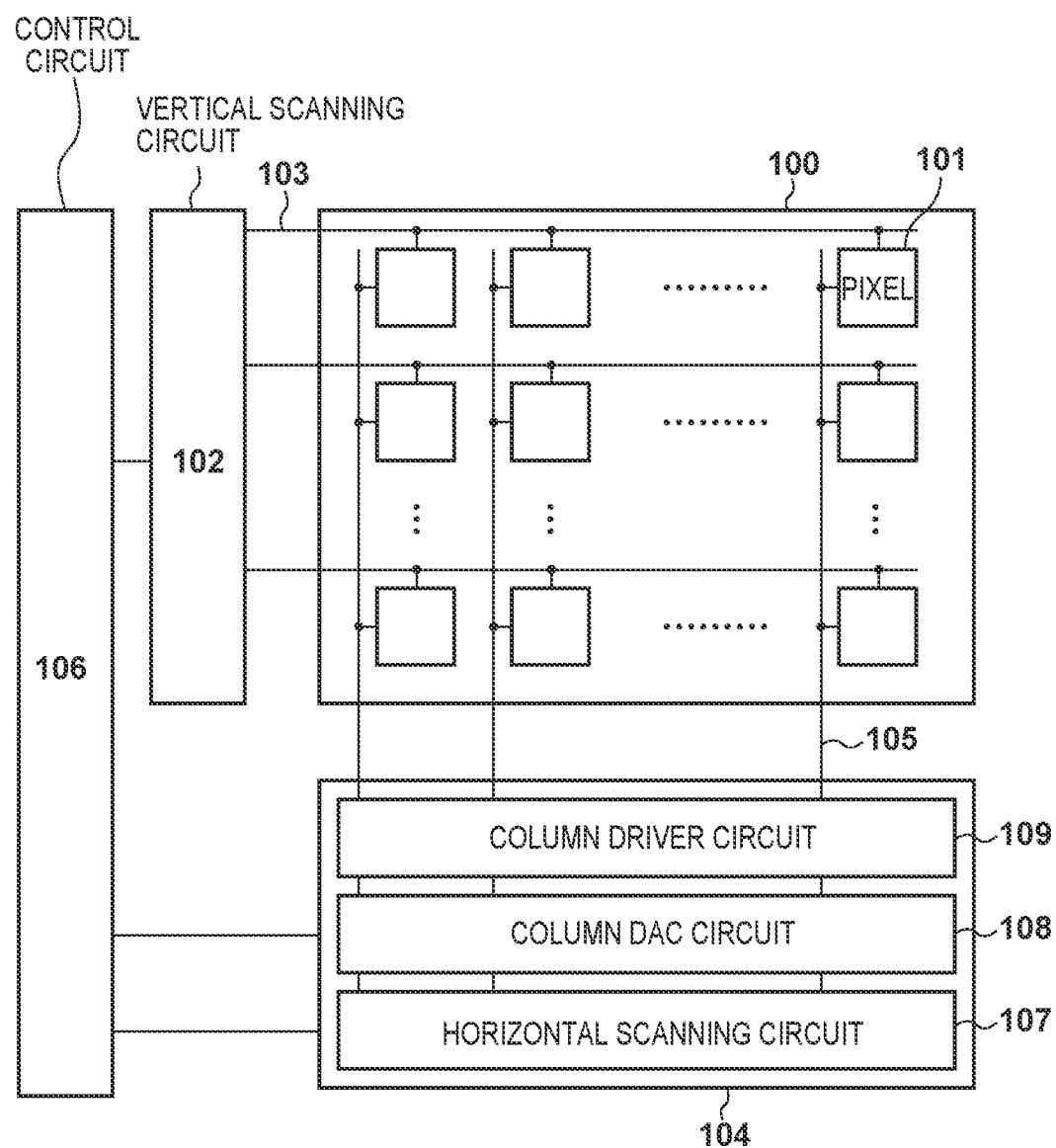
FIG. 1 is a schematic view showing the arrangement of a semiconductor apparatus according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Arrangement Example 1

As an example of an apparatus to which a semiconductor apparatus according to the present invention is applied, a display apparatus is shown in FIG. 1. A pixel array 100 includes a plurality of pixels 101 that are two-dimensionally arrayed. To each pixel 101, a control signal is input from a vertical scanning circuit 102 via a scan line 103, and a brightness signal voltage is input from a signal output circuit 104 via a signal line 105. The vertical scanning circuit 102 and the signal output circuit 104 are controlled by a control circuit 106.

The signal output circuit 104 includes a horizontal scanning circuit 107, a column DAC circuit 108, and a column driver circuit 109. Image data scanned by the horizontal scanning circuit 107 and input to each column is converted into an analog signal voltage by the column DAC circuit 108, and the column driver circuit 109 outputs the brightness signal voltage according to the analog signal voltage.

Figure 2:
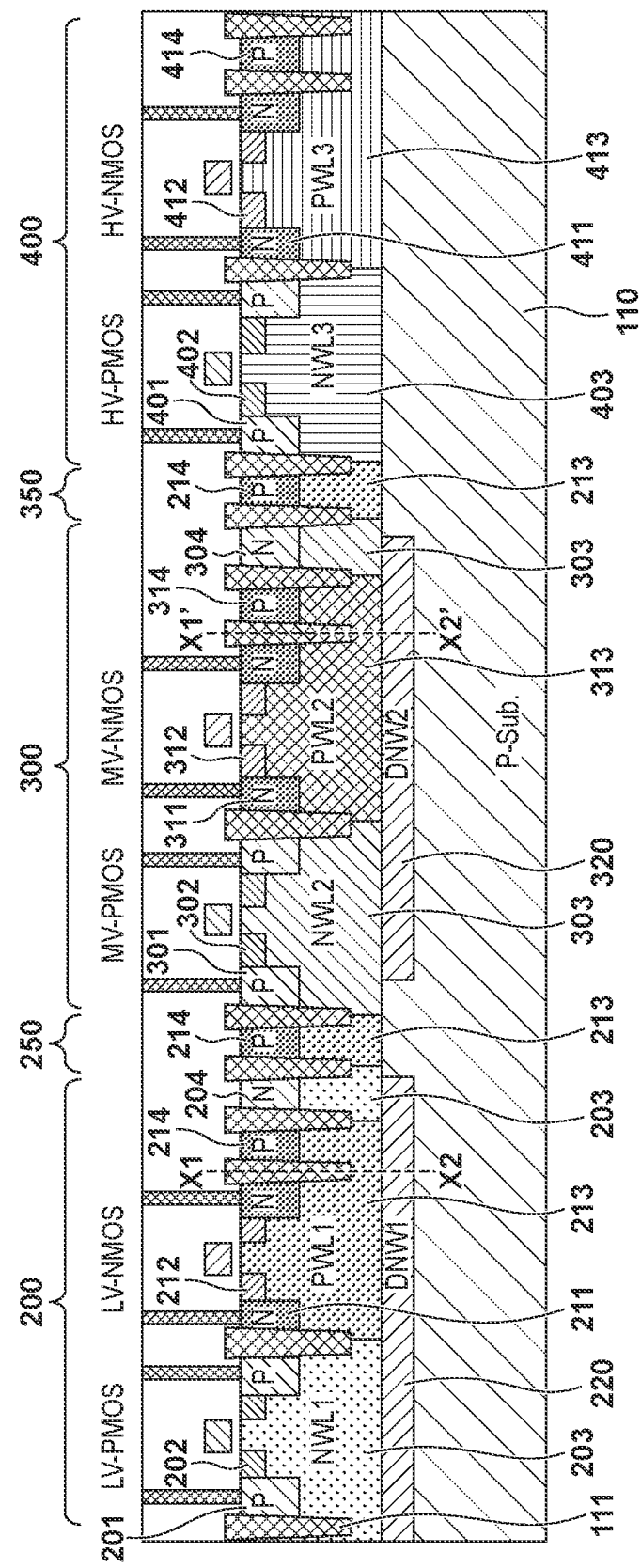
FIG. 2 is a sectional view of the semiconductor apparatus according to the embodiment.

FIG. 2 shows an example of a sectional view of elements mounted in a semiconductor apparatus according to this arrangement example. A triple well structure is formed in the semiconductor region of a semiconductor substrate 110.

The semiconductor substrate 110 includes an isolation portion between elements by a shallow trench isolation 111 (to be referred to as an STI hereinafter). FIG. 2 shows that a number of STIs 111 are used to isolate the elements. The isolation portion between elements is not limited to the shallow trench isolation, and it may be a LOCOS (Local Oxidation Of Silicon), deep trench isolation (DTI), or diffusion isolation by a dopant.

In this arrangement example, a description will be made assuming that the first conductivity type is a p-type, and the second conductivity type is an n-type. However, the first conductivity type may be an n-type, and the second conductivity type may be a p-type. A description will be made here assuming that the semiconductor substrate 110 is of the first conductivity type, and the first conductivity type is a p-type. In the semiconductor substrate 110, a circuit is formed by elements such as a low-voltage operation transistor 200, a medium-voltage operation transistor 300, a high-voltage operation transistor 400, an LV-MV element isolation portion 250, and an MV-HV element isolation portion 350. These are appropriately arranged.

The low-voltage operation transistor 200 includes a low-voltage p-type transistor (LV-PMOS), a low-voltage n-type transistor (LV-NMOS), and the like. The low-voltage p-type transistor (LV-PMOS) includes a source/drain 201 that is the p-type first source or drain, a p-type first lightly doped region 202, a gate, and a gate oxide film. The low-voltage p-type transistor (LV-PMOS) also includes an n-type first semiconductor region 203 (NWL1), and an n-type first well contact region 204 that supplies a well potential to the n-type first semiconductor region 203 (NWL1). An n-type first deep semiconductor region 220 (DNW1) is arranged at a position deeper than a position where the n-type first semiconductor region 203 (NWL1) is formed with respect to the surface side of the semiconductor substrate 110 on which the gate is formed. The n-type first semiconductor region 203 (NWL1) and the n-type first deep semiconductor region 220 (DNW1) are electrically connected. Hence, the potential of the n-type first semiconductor region 203 (NWL1) can arbitrarily be set via the n-type first well contact region 204.

The low-voltage n-type transistor (LV-NMOS) includes an n-type first source/drain 211, an n-type first lightly doped region 212, a gate, and a gate oxide film. The low-voltage n-type transistor (LV-NMOS) also includes a p-type first semiconductor region 213 (PWL1), a p-type first well contact region 214 that supplies the well potential of the p-type first semiconductor region 213. The n-type first semiconductor region 203 (NWL1) is arranged on a side portion of the p-type first semiconductor region 213 (PWL1). The n-type first deep semiconductor region 220 (DNW1) is arranged on the bottom portion of the p-type first semiconductor region 213 (PWL1). The n-type first semiconductor region 203 (NWL1) and the n-type first deep semiconductor region 220 (DNW1) surround the p-type first semiconductor region 213 (PWL1), and the p-type first semiconductor region 213 (PWL1) is electrically isolated from the p-type semiconductor substrate 110. Hence, the potentials of the p-type first semiconductor region 213 (PWL1), the n-type first semiconductor region 203 (NWL1), and the p-type semiconductor substrate 110 can independently be controlled.

The medium-voltage operation transistor 300 includes a medium-voltage p-type transistor (MV-PMOS), a medium-voltage n-type transistor (MV-NMOS), and the like. The medium-voltage p-type transistor (MV-PMOS) includes a p-type second source/drain 301, a p-type second lightly doped region 302, a gate, and a gate oxide film. The medium-voltage p-type transistor (MV-PMOS) also includes an n-type second semiconductor region 303 (NWL2), and an n-type second well contact region 304 that supplies the well potential of the n-type second semiconductor region 303. An n-type second deep semiconductor region 320 (DNW2) is arranged at a position deeper than a position where the n-type second semiconductor region 303 (NWL2) is formed with respect to the surface side of the semiconductor substrate 110 on which the gate is formed. The n-type second semiconductor region 303 (NWL2) and the n-type second deep semiconductor region 320 (DNW2) are electrically connected. Hence, the potential of the n-type second semiconductor region 303 (NWL2) can arbitrarily be set via the n-type second well contact region 304.

The medium-voltage n-type transistor (MV-NMOS) includes an n-type second source/drain 311, an n-type second lightly doped region 312, a gate, and a gate oxide film. The medium-voltage n-type transistor (MV-NMOS) also includes a p-type second semiconductor region 313 (PWL2), and a p-type second well contact region 314 that supplies a well potential to the p-type second semiconductor region 313. The n-type second semiconductor region 303 (NWL2) is arranged on a side portion of the p-type second semiconductor region 313 (PWL2). The n-type second deep semiconductor region 320 (DNW2) is arranged on the bottom portion of the p-type second semiconductor region 313 (PWL2). The n-type second semiconductor region 303 (NWL2) and the n-type second deep semiconductor region 320 (DNW2) surround the p-type second semiconductor region 313 (PWL2), and the p-type second semiconductor region 313 (PWL2) is electrically isolated from the semiconductor substrate 110. Hence, the potentials of the p-type second semiconductor region 313 (PWL2), the n-type second semiconductor region 303 (NWL2), and the semiconductor substrate 110 can independently be controlled.

The high-voltage operation transistor 400 includes a high-voltage p-type transistor (HV-PMOS), a high-voltage n-type transistor (HV-NMOS), and the like. The high-voltage p-type transistor (HV-PMOS) also includes a p-type third source/drain 401, a p-type third lightly doped region 402, a gate, a gate oxide film, and an n-type third semiconductor region 403 (NWL3). The high-voltage n-type transistor (HV-NMOS) includes an n-type third source/drain 411, an n-type third lightly doped region 412, agate, and agate oxide film. The high-voltage n-type transistor (HV-NMOS) also includes a p-type third semiconductor region 413 (PWL3), and a p-type third well contact region 414 that supplies the well potential to the p-type third semiconductor region 413 (PWL3). The p-type third semiconductor region 413 (PWL3) may be set to the same potential as the p-type semiconductor substrate 110 or may be set to a different potential. Note that an n-type semiconductor region may be provided on the bottom portion of the p-type third semiconductor region 413 (PWL3), and the semiconductor substrate 110 and the p-type third semiconductor region 413 (PWL3) may be isolated by the n-type semiconductor region.

The LV-MV element isolation portion 250 and the MV-HV element isolation portion 350 isolate elements of different operation voltages by the p-type first well contact region 214, the p-type first semiconductor region 213 (PWL1), and the like. The isolation layer of the element isolation portion is not limited to the p-type first well contact region 214 and the p-type first semiconductor region 213 (PWL1), and the elements of different potentials may be isolated by the p-type second semiconductor region 313 (PWL2) only in the deep portion of the MV-HV element isolation portion 350. In addition, for the element isolation layer, an isolation portion may be provided between the low-voltage/high-voltage (LV-HV) elements in accordance with the arrangement of the elements.

Figure 3:
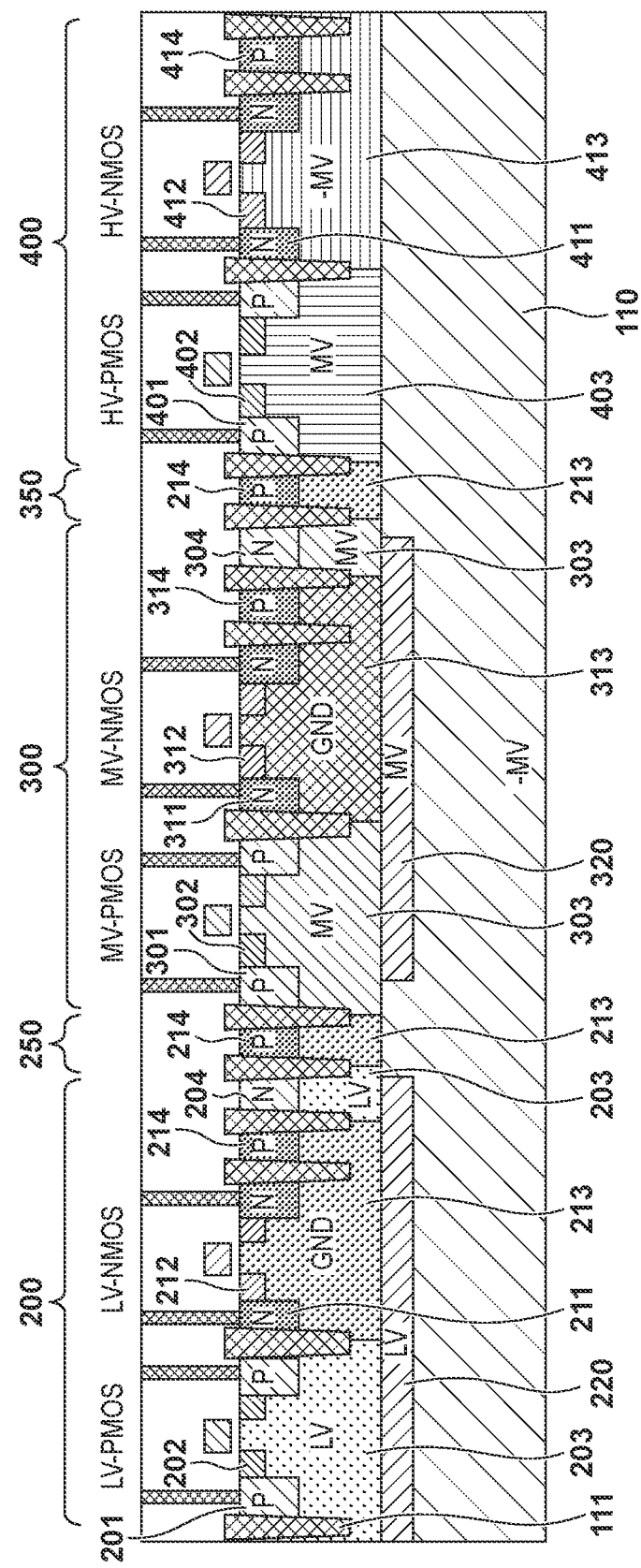
FIG. 3 is a sectional view of the semiconductor apparatus according to the embodiment.

FIG. 3 shows examples of voltages applied to the terminals, the semiconductor regions, and the substrate in a case in which elements that operate at three different voltages are mounted in a mixed manner in the semiconductor apparatus according to an example arrangement. LV and MV to be explained below indicate the magnitudes of the voltages applied to the terminals, and the relationship is given by MV (positive potential)>LV (positive potential).

In the low-voltage operation transistor 200, LV (positive potential) and GND can appropriately be applied to the p-type first source/drain 201, the n-type first source/drain 211, and the gates of the LV-PMOS and the LV-NMOS. The LV (positive potential) is applied to the n-type first semiconductor region 203, the GND is applied to the p-type first semiconductor region 213, and the LV (positive potential) is applied to the n-type first deep semiconductor region 220. To the semiconductor substrate 110, −MV (negative potential) is applied. That is, different potentials are applied to the semiconductor substrate 110, the n-type first semiconductor region 203, and the p-type first semiconductor region 213. Voltage control of the n-type first semiconductor region 203 and the p-type first semiconductor region 213 can be performed independently of the semiconductor substrate 110. The potential of the semiconductor substrate 110 is not limited to the GND, and may be fixed by a positive or negative bias voltage, as shown in FIG. 3.

In the medium-voltage operation transistor 300, MV (positive potential) and GND can appropriately be applied to the p-type second source/drain 301, the n-type second source/drain 311, and the gates of the MV-PMOS and the MV-NMOS. The MV (positive potential) is applied to the n-type second semiconductor region 303, the GND is applied to the p-type second semiconductor region 313, and the MV (positive potential) is applied to the n-type second deep semiconductor region 320. To the semiconductor substrate 110, −MV (negative potential) is applied. That is, different potentials can be applied to the semiconductor substrate 110, the n-type second semiconductor region 303, and the p-type second semiconductor region 313. Voltage control of the n-type second semiconductor region 303 (NWL2) and the p-type second semiconductor region 313 (PWL2) can be performed independently of the semiconductor substrate 110.

In the high-voltage operation transistor 400. MV (positive potential) and −MV (negative potential) can appropriately be applied to the p-type third source/drain 401, the n-type third source/drain 411, and the gates of the HV-PMOS and the HV-NMOS. The MV (positive potential) is applied to the n-type third semiconductor region 403, the −MV (negative potential) is applied to the p-type third semiconductor region 413, and the −MV (negative potential) is applied to the semiconductor substrate 110 as well. That is, the p-type semiconductor substrate 110 and the p-type third semiconductor region 413 are set to the same potential and can share a power supply.

With the above-described arrangement, since the potentials of the semiconductor regions can independently be set, the operation voltages of the transistors can independently be controlled, the degree of freedom in circuit design improves, and a semiconductor apparatus with low power consumption can be implemented. Note that the different operation voltages of the transistors are not limited to three voltages. Also, in the circuit including the elements of the plurality of operation voltages, various transistors whose operating points are changed may be provided, and a modification can be made without departing from the scope.

Figure 4A:
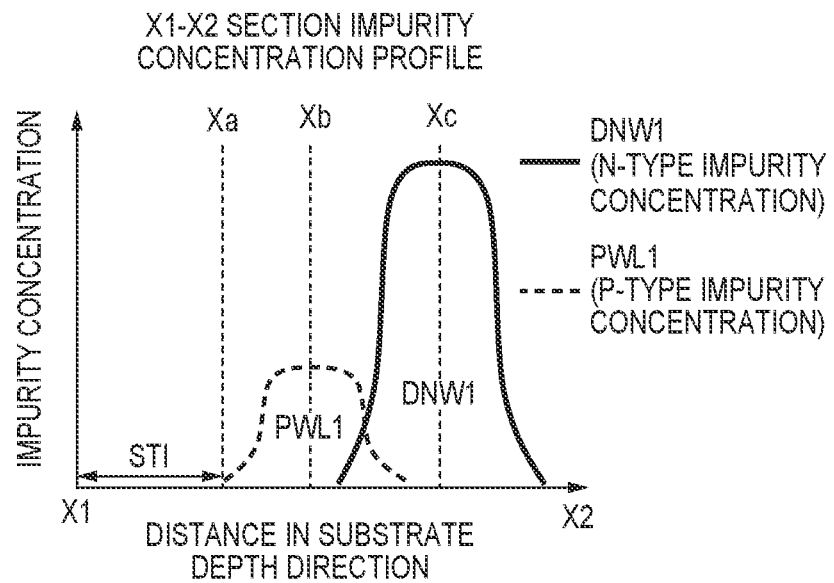
FIGS. 4A and 4B are sectional views of the impurity concentration distribution of the semiconductor apparatus according to the embodiment.
Figure 4B:
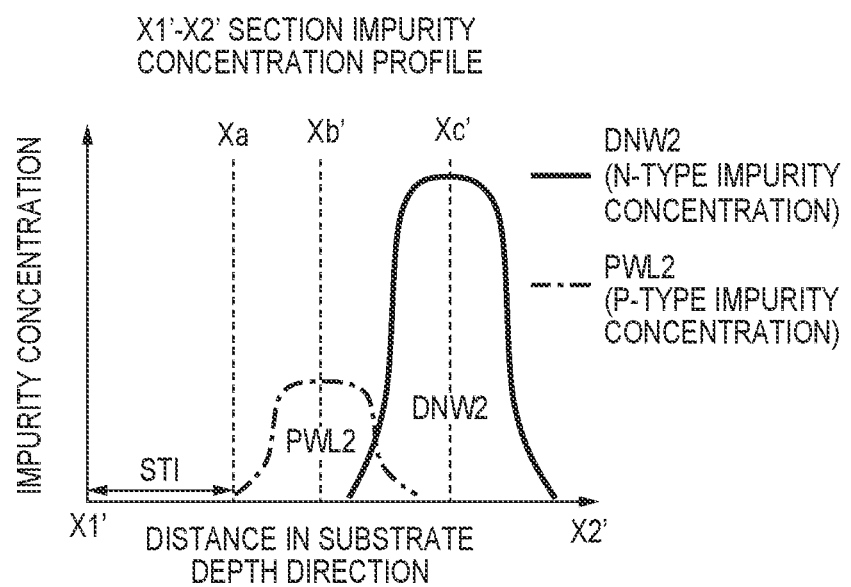

FIG. 4A shows examples of the profiles of net n- and p-type impurity concentrations on an X1-X2 section of the low-voltage n-type transistor (LV-NMOS) portion shown in FIG. 2. FIG. 4B shows examples of the profiles of net n- and p-type impurity concentrations on an X1'-X2' section of the medium-voltage n-type transistor (MV-NMOS) portion. Note that an impurity concentration indicates a net impurity concentration hereinafter unless otherwise specified. In FIG. 4A, the abscissa represents the depth from the surface of the semiconductor substrate, and the ordinate represents impurity concentration distributions under the STI in the p-type first semiconductor region 213 (PWL1) and the n-type first deep semiconductor region 220 (DNW1). If a depth Xa is the depth of the bottom portion of the STI, the concentration in the p-type first semiconductor region 213 (PWL1) has a peak at a depth Xb, and the concentration in the n-type first deep semiconductor region 220 (DNW1) has a peak at a depth Xc.

The impurity concentrations at the depths Xb and Xc are compared. The n-type first deep semiconductor region 220 is formed at a position deeper than the p-type first semiconductor region 213, and has a higher impurity concentration. Similarly, in FIG. 4B, the abscissa represents the depth from the surface of the semiconductor substrate, and the ordinate represents impurity concentration distributions under the STI in the p-type second semiconductor region 313 (PWL2) and the n-type second deep semiconductor region 320 (DNW2). The concentration in the p-type second semiconductor region 313 has a peak at a depth Xb', and the concentration in the n-type second deep semiconductor region 320 has a peak at a depth Xc'. The impurity concentrations at the depths Xb' and Xc' are compared. Then-type second deep semiconductor region 320 is formed at a position deeper than the p-type second semiconductor region 313, and has a higher impurity concentration.

As indicated by the relationships shown in FIGS. 4A and 4B, in this example, the concentration is lower in the p-type first and second semiconductor regions than in the first and second deep semiconductor regions. As a feature of the present example, in addition to a triple well structure including the DNW1 in the p-type semiconductor substrate, and PWL1 in it, a triple well structure including the DNW2 in the p-type semiconductor substrate, and PWL2 in it exists. The two triple well structures include transistors of different operation voltages, as described above. As an additional feature, as for the relationship of impurity concentrations, the concentration is lower in the p-type first semiconductor region 213 (PWL1) or the p-type second semiconductor region 313 (PWL2) than in the n-type first deep semiconductor region 220 (DNW1) or the n-type second deep semiconductor region 320 (DNW2). The reason why such a concentration relationship is set will be described next.

Figure 5:
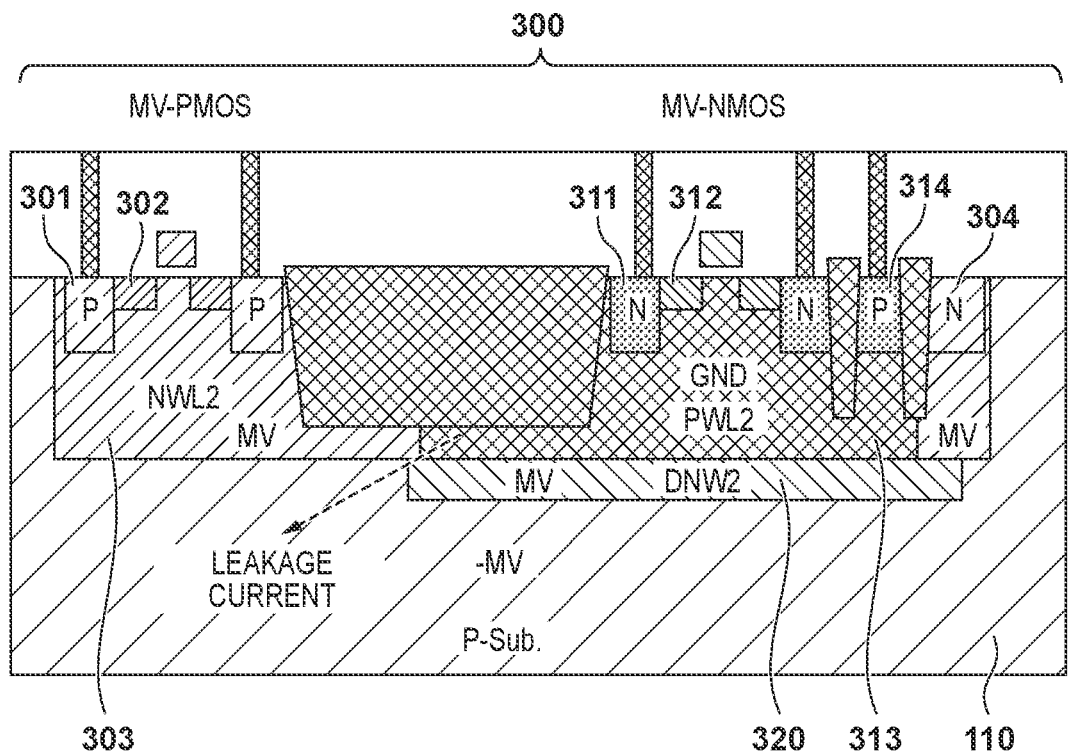
FIG. 5 is a sectional view of the semiconductor apparatus according to the embodiment.

FIG. 5 shows an example of a section of a circuit portion in which the medium-voltage operation transistor 300 is mounted. The p-type second semiconductor region 313 is electrically isolated from the semiconductor substrate 110 by the n-type second semiconductor region 303 and the n-type second deep semiconductor region 320. The GND potential is applied to the p-type second semiconductor region 313, the MV potential (positive potential) is applied to the n-type second semiconductor region 303, and MV potential (positive potential) is applied to the n-type second deep semiconductor region 320 as well, and the −MV potential (negative potential) is applied to the semiconductor substrate 110. In this way, the bias potentials of the elements can independently be controlled. However, as in an example shown in FIG. 5, if the overlap amount at the boundary portion between the n-type second semiconductor region 303 and the n-type second deep semiconductor region 320 is small, a depletion layer extends at the boundary portion, and a leakage current may be generated in a portion where the n-type concentration is low.

This is because the reverse bias of the p-n junction is applied between the semiconductor substrate 110 and the n-type second deep semiconductor region 320, and the reverse bias of the p-n junction is simultaneously applied between the p-type second semiconductor region 313 and the n-type second deep semiconductor region 320 as well. Hence, if the impurity concentration of the n-type second deep semiconductor region 320 is low, the depletion layer extends to the side of the n-type second deep semiconductor region 320. For this reason, the potential barrier of the n-type second deep semiconductor region 320 lowers, and a current readily flows between the p-type second semiconductor region 313 and the semiconductor substrate 110. In addition, if the depletion layer extends to the n-type second semiconductor region 303 as well, a leakage current may flow from the p-type second semiconductor region 313 to the semiconductor substrate 110 via the depletion layer.

To suppress the leakage current, the impurity concentration in the n-type first deep semiconductor region 220 or the n-type second deep semiconductor region 320 is made higher than the impurity concentration of the first conductivity type in the p-type first semiconductor region 213 or the p-type second semiconductor region 313. That is, impurity concentration profiles as shown in FIGS. 4A and 4B are obtained. This can suppress extension of the depletion layer in the n-type first deep semiconductor region 220 or the n-type second deep semiconductor region 320 at the time of application of the reverse bias, and suppress a leakage current between the p-type substrate 110 and the p-type semiconductor regions (213 and 313). Also, in addition to adjusting the impurity concentrations, the overlap amount between the n-type second semiconductor region 303 and the n-type second deep semiconductor region 320 is set to such a width that prevents the influence of the depletion layer, thereby suppressing the leakage current. The width of the overlap can be set to be equal to or larger than the width of a high-impurity concentration portion of the second deep semiconductor region 320 in the depth direction. In the profiles shown in FIGS. 4A and 4B, the width can be set to the width of the profile at a position where the impurity concentration along the ordinate is 80% of the maximum. The second deep semiconductor region 320 may be arranged across the bottom portion of the second semiconductor region 303 arranged on a side portion.

With the above-described relationship of impurity concentrations, even if the overlap amount at the boundary portion between the n-type second deep semiconductor region 320 and the n-type second semiconductor region 303 is small, as shown in FIG. 5, the leakage current can be suppressed for a variety of bias potentials. It is also possible to implement a semiconductor apparatus that suppresses power consumption by applying appropriate voltages to elements.

Arrangement Example 2

This arrangement example will be described next with reference to FIGS. 6 and 7. This arrangement example shows a method of suppressing a leakage current flowing to a well by individually designing the impurity concentrations in the p-type first semiconductor region 213 and the p-type second semiconductor region 313. Components different from Arrangement Example 1 will mainly be described below.

Figure 6:
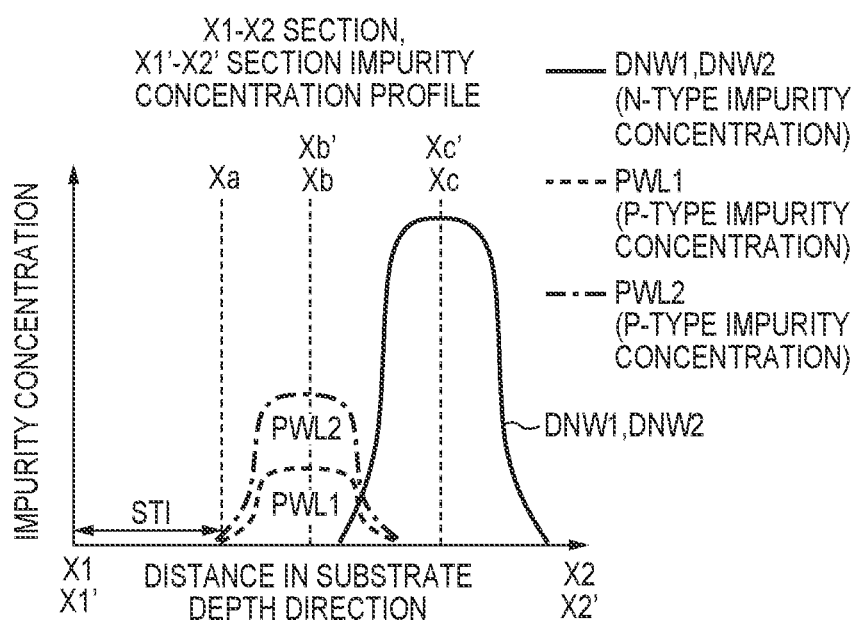
FIG. 6 is a sectional view of the impurity concentration distribution of the semiconductor apparatus according to the embodiment.

FIG. 6 shows examples of the profiles of n- and p-type impurity concentrations on the X1-X2 section of the low-voltage n-type transistor (LV-NMOS) portion shown in FIG. 2 and on the X1'-X2' section of the medium-voltage n-type transistor (MV-NMOS) portion. In FIG. 6, the abscissa represents the depth from the surface of the semiconductor substrate, and the ordinate represents the impurity concentration. Here, FIG. 6 shows the impurity concentration distributions under the STI in the p-type first semiconductor region 213 (PWL1), the p-type second semiconductor region 313 (PWL2), the n-type first deep semiconductor region 220 (DNW1), and the n-type second deep semiconductor region 320 (DNW2).

The p-type first semiconductor region 213 (PWL1) and the p-type second semiconductor region 313 (PWL2) have concentration peaks at the depths Xb and Xb'. The n-type first deep semiconductor region 220 (DNW1) and the n-type second deep semiconductor region 320 (DNW2) have concentration peaks at the depths Xc and Xc'. The impurity concentrations at the depths Xb and Xc are compared. The p-type second semiconductor region 313 (PWL2) has a higher impurity concentration on the bottom portion of the STI than the p-type first semiconductor region 213 (PWL1). On the other hand, the concentrations and depths in the n-type first deep semiconductor region 220 (DNW1) and the n-type second deep semiconductor region 320 (DNW2) are equal.

The low-voltage operation transistor 200 is mounted in the p-type first semiconductor region 213 (PWL1). The medium-voltage operation transistor 300 is mounted in the p-type second semiconductor region 313 (PWL2). FIG. 6 shows that as for the p-type impurity concentration on the bottom portion of the STI, the concentration is higher in the medium voltage portion than in the low voltage portion. As described above, the concentrations in the p-type semiconductor regions of the low voltage portion and the medium voltage portion are controlled from the viewpoint of leakage current suppression. The reason will be described below.

Figure 7A:
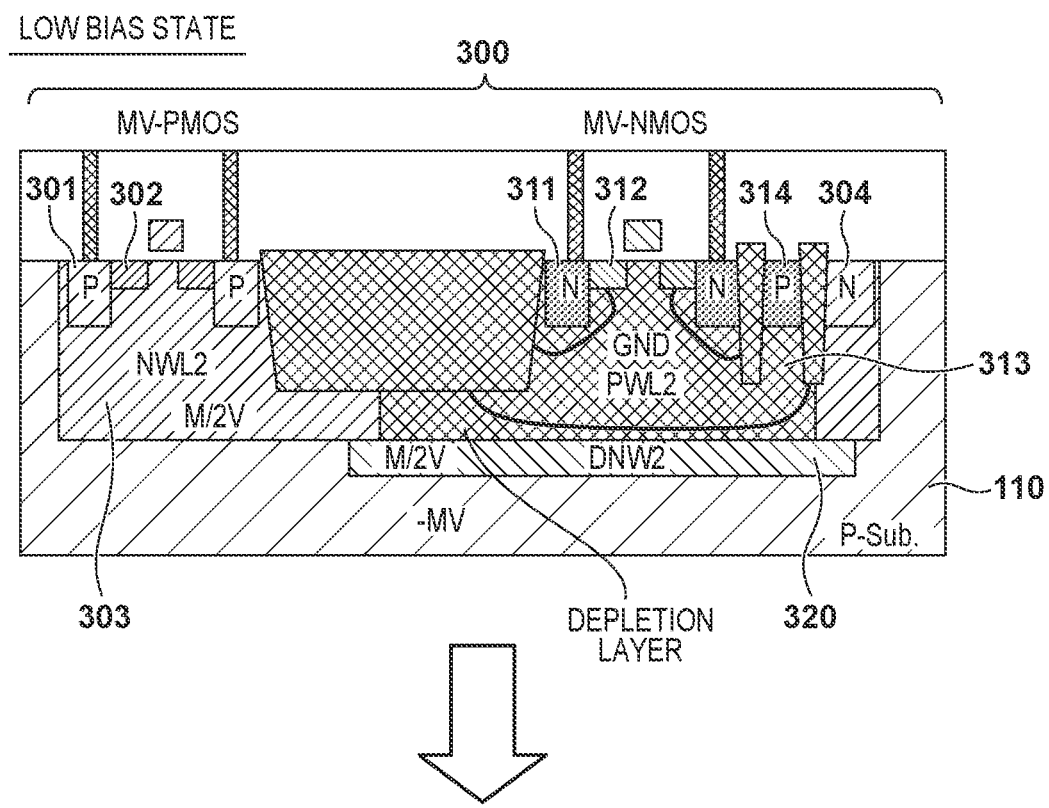
FIGS. 7A and 7B are sectional views of the semiconductor apparatus according to the embodiment.
Figure 7B:
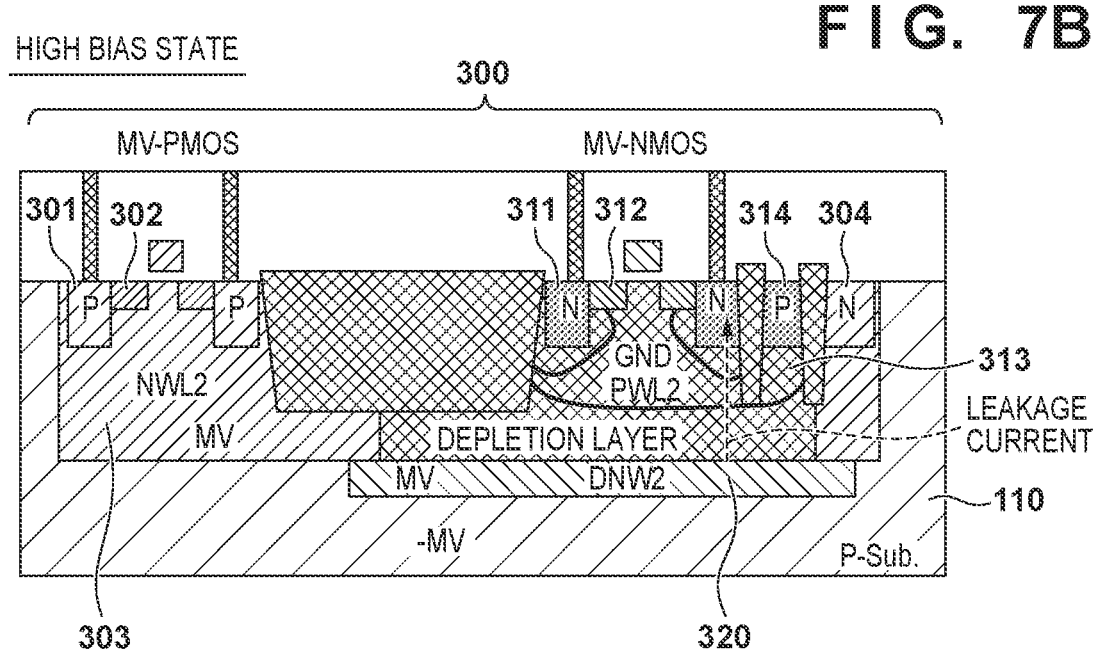

FIGS. 7A and 7B show applied potentials in a process of raising a voltage until a predetermined MV potential (positive potential) is applied to the medium-voltage n-type transistor (MV-NMOS) 300 and the behavior of a depletion layer in the MV-NMOS 300. FIG. 7A shows a low bias state, and FIG. 7B shows a high bias state. In FIG. 7A, the GND potential is applied to the n-type second source/drain 311 and the p-type second semiconductor region 313. An M/2V potential (positive potential) is applied to the n-type second semiconductor region 303 and the n-type second deep semiconductor region 320, and a −MV potential (negative potential) is applied to the semiconductor substrate 110. The M/2V potential (negative potential) represents a potential half the MV (positive potential). A depletion layer formed on the p-n junction interface of the p-type second semiconductor region 313 of the MV-NMOS 300 when the above-described bias is applied is indicated by a solid line. Depletion layers exist between the n-type second deep semiconductor region 320 and the p-type second semiconductor region 313 and between the n-type second source/drain 311 and the p-type second semiconductor region 313.

Next, FIG. 7B shows a change of the depletion layer when the potential applied to the n-type second semiconductor region 303 and the n-type second deep semiconductor region 320 is changed up to the MV potential (positive potential). When the potential is raised up to the MV potential (positive potential), the depletion layer from the n-type second deep semiconductor region 320 in the p-type second semiconductor region 313 extends in the substrate surface direction in accordance with the bias voltage, and reaches the bottom portion of the STI 111. At this time, the potential of the p-type second semiconductor region 313 in the MV-NMOS 300 cannot be supplied from the p-type second well contact region 314 by the STI 111 and the depletion layer on the bottom portion of the STI 111. In this case, the potential of the semiconductor region under the MV-NMOS 300 becomes unstable, and the built-in potential generated across the p-n junction cannot be maintained. Hence, the potential barrier of the p-type second semiconductor region 313 lowers, and a leakage current flows between the n-type second source/drain 311 and the n-type second deep semiconductor region 320.

Based on these mechanisms, in the triple well structure according to the present example, extension of the depletion layer on the bottom portion of the STI 111 can be suppressed in the p-type second semiconductor region 313 where the operation voltage is high, that is, a high reverse bias is applied to the p-n junction. The extension of the depletion layer at the time of reverse bias application greatly depends on the concentration on the low concentration side, that is, in the p-type second semiconductor region 313. For this reason, increasing the concentration in the p-type second semiconductor region 313 on the bottom portion of the STI 111 is advantageous in suppressing the leakage current from the medium-voltage operation transistor 300. On the other hand, a similar phenomenon may occur even in the p-type first semiconductor region 213 where the low-voltage operation transistor 200 is arranged. However, the effective reverse bias potential applied to the p-type first semiconductor region 213 is lower than in the medium-voltage operation transistor 300, and as a result, extension of the depletion layer is suppressed, and the leakage current is hardly generated.

In addition, if the concentration in the p-type first semiconductor region 213 is increased, the dopant diffuses to the channel portion of the low-voltage operation transistor 200, affecting the operation point variation of the transistor. Hence, when the concentration in the p-type second semiconductor region 313 on the bottom portion of the STI 111 is made higher than in the p-type first semiconductor region 213, a high-performance semiconductor apparatus can be implemented while suppressing an increase in current consumption caused by the leakage current.

Arrangement Example 3

This arrangement example will be described next with reference to FIGS. 8A to 8C. In this arrangement example, without drastically adding a manufacturing processes, the carrier concentrations in the n-type first deep semiconductor region 220 and the n-type second deep semiconductor region 320 are individually controlled, thereby obtaining the same effects as in Arrangement Example 2. Components different from Arrangement Example 2 will mainly be described below.

Figures 8A, 8B, 8C:
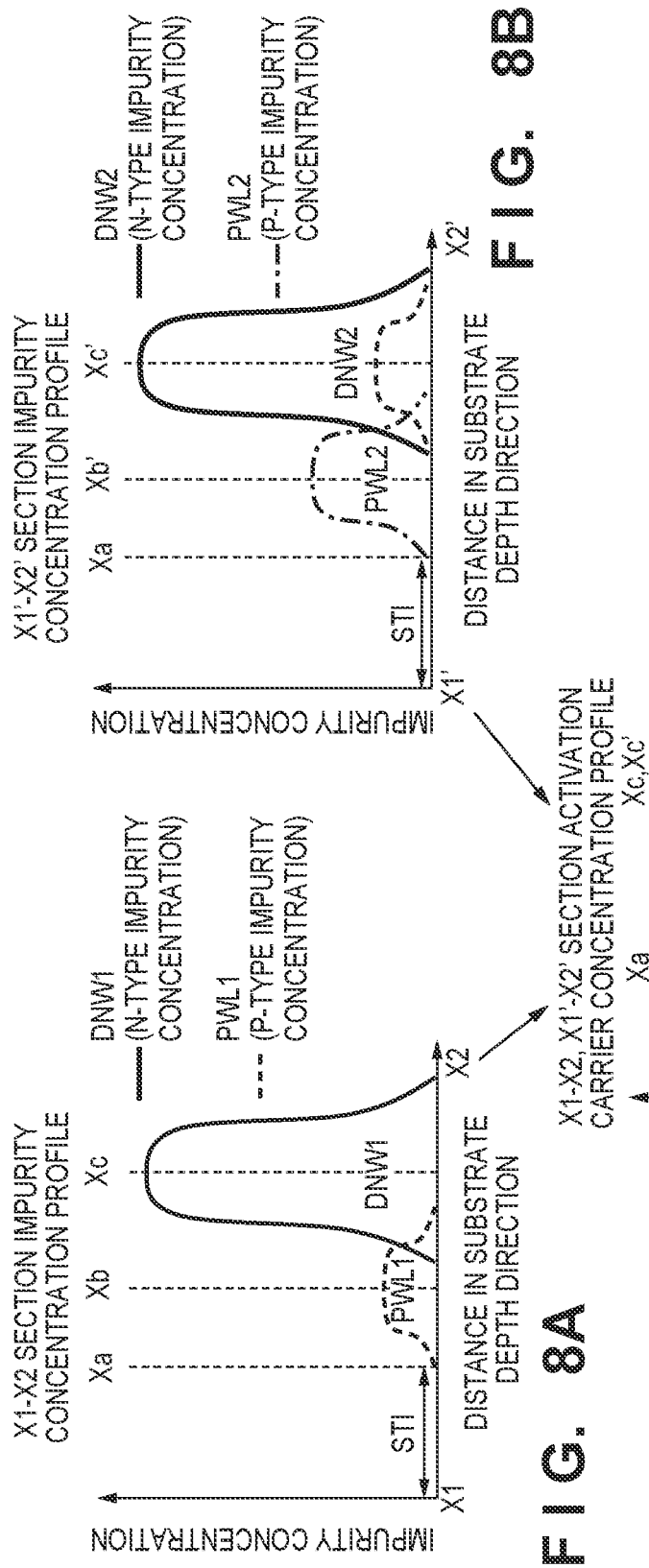
FIGS. 8A, 8B, and 8C are sectional views of the impurity concentration distribution of the semiconductor apparatus according to the embodiment.

FIGS. 8A to 8C show examples of the profiles of n- and p-type impurity concentrations on the X1-X2 section of the low-voltage n-type transistor (LV-NMOS) portion shown in FIG. 2 and on the X1'-X2' section of the medium-voltage n-type transistor (MV-NMOS) portion. In FIG. 8A, the abscissa represents the depth from the surface of the semiconductor substrate, and the ordinate represents the impurity concentrations under the STI in the p-type first semiconductor region 213 (PWL1) and the n-type first deep semiconductor region 220 (DNW1). FIG. 8B shows the impurity concentrations under the STI in the p-type second semiconductor region 313 (PWL2) and the n-type second deep semiconductor region 320 (DNW2).

As shown in FIGS. 8A and 8B, as for the concentrations of the p-type impurity at the depths Xb and Xb', as described in Arrangement Example 2. The concentration in the p-type second semiconductor region 313 is higher than in the p-type first semiconductor region 213. Next, the concentrations of the dopant at the depth Xc and Xc' are compared. The n-type first deep semiconductor region 220 and the n-type second deep semiconductor region 320 (DNW2) have the same impurity concentration under the STI. In this example, however, the p-type second semiconductor region 313 is introduced even at the depth Xc', as indicated by a dotted line.

Based on the above-described impurity concentration distributions, FIG. 8C shows the activation carrier concentrations under the STI in the n-type first deep semiconductor region 220 and the n-type second deep semiconductor region 320 (DNW2). At the depth Xc', the concentration in the p-type second semiconductor region 313 is high. For this reason, the activation carrier concentration under the STI is higher in the n-type first deep semiconductor region 220 than in the n-type second deep semiconductor region 320. That is, in the n-type second deep semiconductor region 320, the n-type second deep semiconductor region 320 with a doner concentration lower than prior examples is formed. As described in Arrangement Example 2, in the p-type second semiconductor region 313 in which a high reverse bias is applied to the p-n junction, extension of the depletion layer on the bottom portion of the STI can be suppressed. As for the suppression of the depletion layer, the same effect can be obtained by lowering the carrier concentration in the n-type second deep semiconductor region 320. In addition, concentration adjustment in the semiconductor region at the depth Xc' can be implemented by executing multi-stage ion implantation by energy corresponding to the depth Xc' in the same step as the p-type second semiconductor region 313.

Arrangement Example 4

This arrangement example will be described next with reference to FIGS. 9 and 10. This arrangement example is a modification of Arrangement Examples 1 to 3 and shows a method of improving the element isolation breakdown voltage between different potentials. Components different from Arrangement Examples 1 to 3 will mainly be described below.

Figure 9:
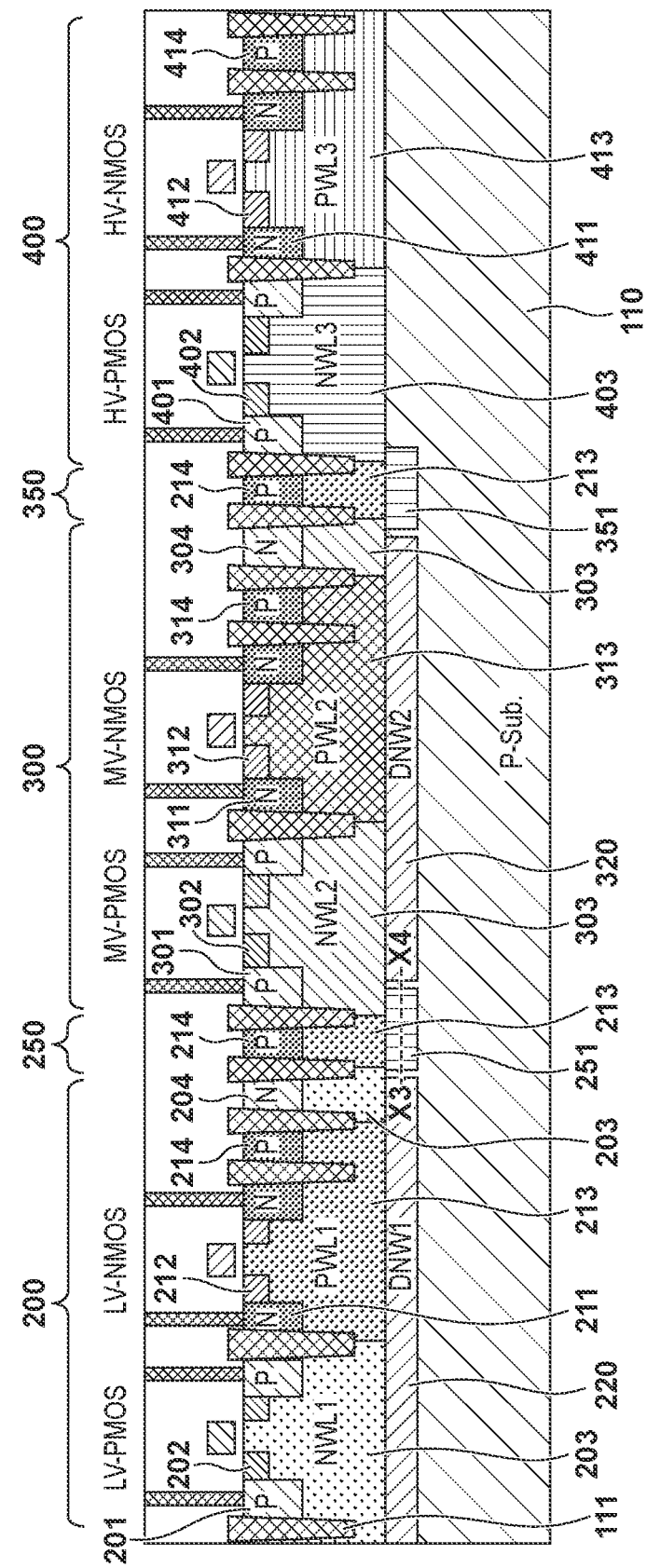
FIG. 9 is a sectional view of the semiconductor apparatus according to the embodiment.

FIG. 9 shows an example in which a p-type first deep semiconductor region 251 is added to the LV-MV element isolation portion 250, and a p-type second deep semiconductor region 351 is added to the MV-HV element isolation portion 350 shown in FIG. 2. In Arrangement Example 1, the elements of different potentials between the n-type first deep semiconductor region 220 and the n-type second deep semiconductor region 320 are isolated by the p-type region of the semiconductor substrate 110. However, if the impurity concentrations in the n-type first deep semiconductor region 220 and the n-type second deep semiconductor region 320 are increased, a depletion layer may extend between the n-type first deep semiconductor region 220 and the n-type second deep semiconductor region 320, and a leakage current may be generated. Even by the operation voltages of the low-voltage operation transistor 200 and the medium-voltage operation transistor 300, a depletion layer may extend between the n-type first deep semiconductor region 220 and the n-type second deep semiconductor region 320, and a leakage current may be generated. In this case, when the p-type first deep semiconductor region 251 and the p-type second deep semiconductor region 351 are formed, the breakdown voltage of the elements between the different potentials can be improved.

Figure 10:
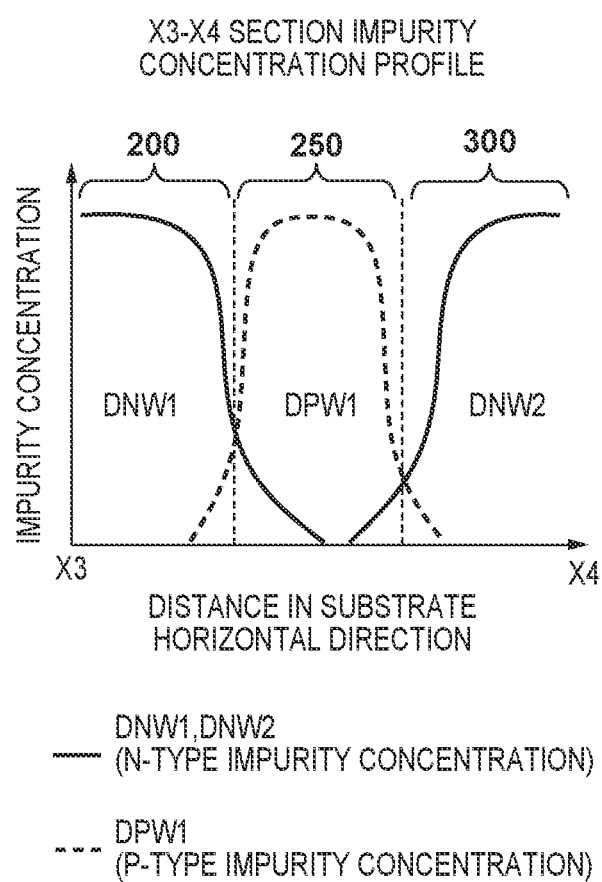
FIG. 10 is a sectional view of the impurity concentration distribution of the semiconductor apparatus according to the embodiment.

FIG. 10 shows examples of the profiles of n- and p-type impurity concentrations on an X3-X4 section in the low-voltage operation transistor 200, the medium-voltage operation transistor 300, and the LV-MV element isolation portion 250 corresponding to the boundary between them in FIG. 9. The abscissa represents the distance in the horizontal direction of the semiconductor substrate, and the ordinate represents the impurity concentration distributions in the n-type first deep semiconductor region 220 (DNW1), the n-type second deep semiconductor region 320 (DNW2), and the p-type first deep semiconductor region 251 (DPW1). The impurity concentration in the p-type first deep semiconductor region 251 of the LV-MV element isolation portion 250 is set equal to that in the n-type deep semiconductor regions of the low-voltage operation transistor 200 and the medium-voltage operation transistor 300. This can suppress the leakage current between the n-type first deep semiconductor region 220 and the n-type second deep semiconductor region 320. Similarly, the impurity concentrations in the adjacent portions in the horizontal direction in the n-type first semiconductor region 203 and the p-type first semiconductor region 213, which are adjacent in the horizontal direction, can be set equal from the viewpoint of breakdown voltage. Also, similarly, even between the n-type second semiconductor region 303 and the p-type second semiconductor region 313 and between the n-type third semiconductor region 403 and the p-type third semiconductor region 413, the impurity concentrations in the adjacent portions in the horizontal direction can be set equal from the viewpoint of breakdown voltage.

Additionally, in this embodiment, the depth of the p-type first deep semiconductor region 251 is not limited, and the p-type first deep semiconductor region 251 may be formed to have a concentration peak at the depth of the bottom portion of the STI in the region of the p-type first semiconductor region 213. As for the element isolation layer, an isolation portion may be provided between low- and high-voltage (LV-HV) elements or between medium- and high-voltage (MV-HV) elements, and various combinations are possible.

Arrangement Example 5

This arrangement example will be described next with reference to FIG. 11. This arrangement example shows a manufacturing method of a bipolar transistor mounted in the reference voltage generation circuit of the column DAC circuit 108 as an example in a semiconductor apparatus. Components different from Arrangement Example 1 will mainly be described below.

Figure 11:
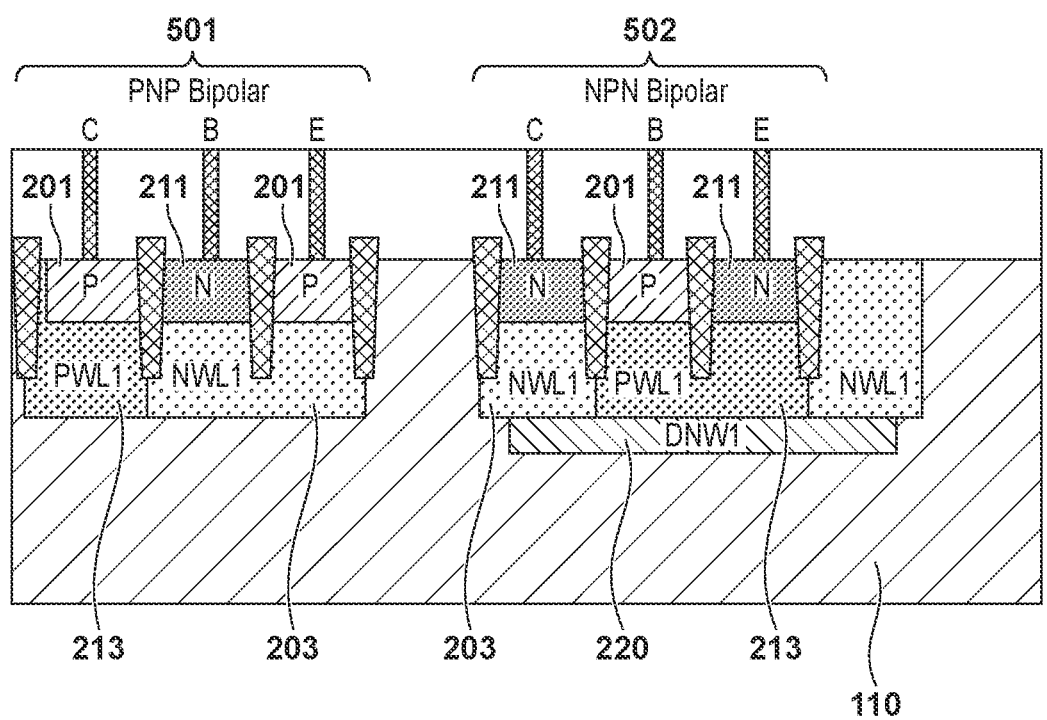
FIG. 11 is a sectional view of the semiconductor apparatus according to the embodiment.

FIG. 11 is a sectional view of a PNP bipolar transistor 501 and an NPN bipolar transistor 502 of an STI 111 isolation type. The PNP bipolar transistor 501 includes electrodes including p-type collector and emitter and an n-type base. The NPN bipolar transistor 502 includes electrodes including n-type collector and emitter and a p-type base. The electrodes of the bipolar transistors and constituent elements such as the p-type first semiconductor region 213 and the n-type first deep semiconductor region 220 are the same as the constituent elements of the low-voltage operation transistor 200 and can be formed by the same mask. In particular, since these can be formed together by sharing the mask of the n-type first semiconductor region 203 and the p-type first semiconductor region 213, the bipolar transistors can be formed without increasing manufacturing processes.

This is because making the concentration in the bottom portion of the STI 111 lower in the p-type first semiconductor region 213 than in the p-type second semiconductor region 313 is advantageous, as described in Arrangement Example 2. Also, the n-type first semiconductor region 203 adjacent to the p-type first semiconductor region 213 in the horizontal direction can also be formed at the same concentration as the p-type first semiconductor region 213. Hence, the base concentration in the first semiconductor region 203 and the p-type first semiconductor region 213 on the bottom portion of the STI 111, which serve as the mask of the base regions of the bipolar transistors, is reduced. For this reason, the PNP bipolar transistor 501 and the NPN bipolar transistor 502 with a high DC current amplification factor can be formed. Also, when only the base regions of the bipolar transistors may be formed as base regions of a low concentration by executing ion implantation using another mask without sharing the mask of the n-type first semiconductor region 203 and the p-type first semiconductor region 213, and various modifications can be made.

Manufacturing Method of Semiconductor Apparatus

A manufacturing method of a semiconductor apparatus will exemplarily be described below with reference to FIGS. 12A to 12G. In FIGS. 12A to 12G, the same reference numerals are added to members before processing and members after processing for the sake of easy description.

Figure 12A:
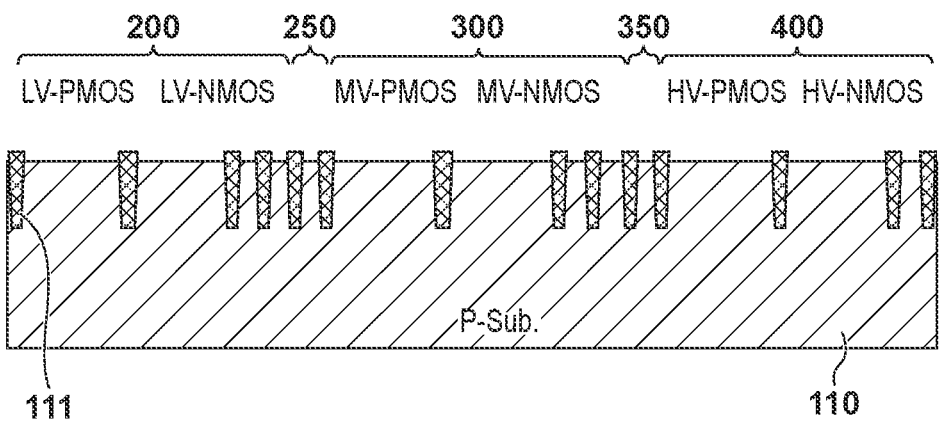

The step shown in FIG. 12A shows an example of a manufacturing method of forming an element isolation portion STI 111 in a semiconductor apparatus. A semiconductor substrate is prepared. A semiconductor substrate 110 having, for example, a first surface and a second surface and including a semiconductor region of, for example, a p-type as the first conductivity type is prepared. Assume here that a semiconductor apparatus as shown in FIG. 1 is manufactured. A hard mask having an opening pattern and made of polysilicon or a silicon nitride film is formed in a region where the STI 111 for isolating a pixel array 100, a low-voltage operation transistor 200, a medium-voltage operation transistor 300, a high-voltage operation transistor 400, and the like should be formed. After that, the semiconductor substrate 110 is etched using the hard mask, thereby forming trenches. The depth of the trenches is, for example, about 150 to 900 nm, and can be adjusted in accordance with an isolation breakdown voltage required for the high-voltage operation transistor 400.

Also, an insulating film formed along the inner wall of each trench is formed on the side surface and the bottom surface of the trench. More specifically, an insulating film is formed on the side surface and the bottom surface of the trench by thermal oxidation in an oxidizing gas atmosphere. After that, an insulating body filled in the trench is formed to cover the insulating film formed along the inner wall of the trench. The insulating body filled in the trench is, for example, a silicon oxide film formed by high-density plasma CVD. The insulating body filled in the trench is planarized by a combination of etching and CMP. After that, a thermal oxide film is formed on the surface of the semiconductor substrate 110. The thermal oxide film is formed to suppress channeling in ion implantation. The STIs 111 are formed in this way at predetermined portions, as shown in FIG. 12A.

Note that an example is shown here in which the STIs 111 are formed to a uniform depth in the regions of the pixel array 100, the low-voltage operation transistor 200, the medium-voltage operation transistor 300, the high-voltage operation transistor 400, and the like. However, for example, the STIs 111 having different depths between the regions may be formed by forming a hard mask of polysilicon or a silicon nitride film in each region.

Figure 12B:
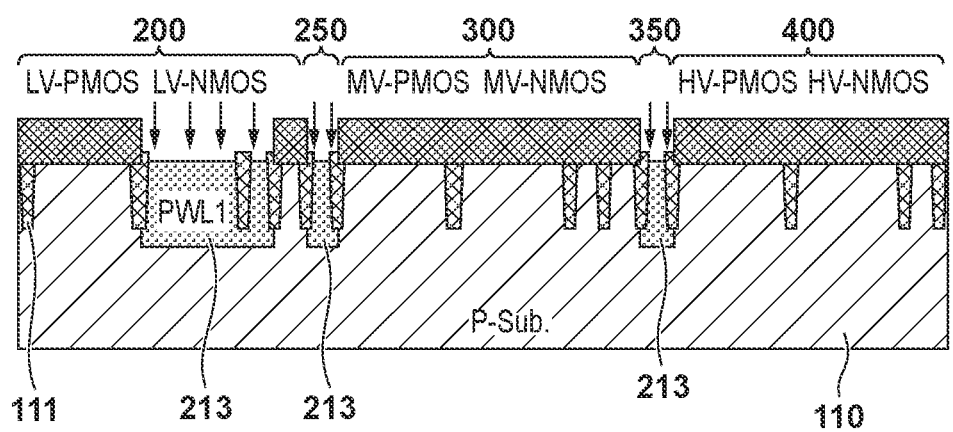

In the step shown in FIG. 12B, in a state in which predetermined regions are protected by a resist, a p-type first semiconductor region 213 is formed by multi-stage ion implantation. In the multi-stage ion implantation, for example, the acceleration energy can be adjusted within the range of 10 to 2,000 keV, and the dose amount can be adjusted within the range of 1e11 to 5e13/cm$^2$. The dose amount may be changed by the depth of multi-stage ion implantation. A high-concentration semiconductor region may be formed in a region shallower than the bottom portion of the STI 111, and a low-concentration semiconductor region may be formed in a region deeper than the bottom portion of the STI 111.

Figure 12C:
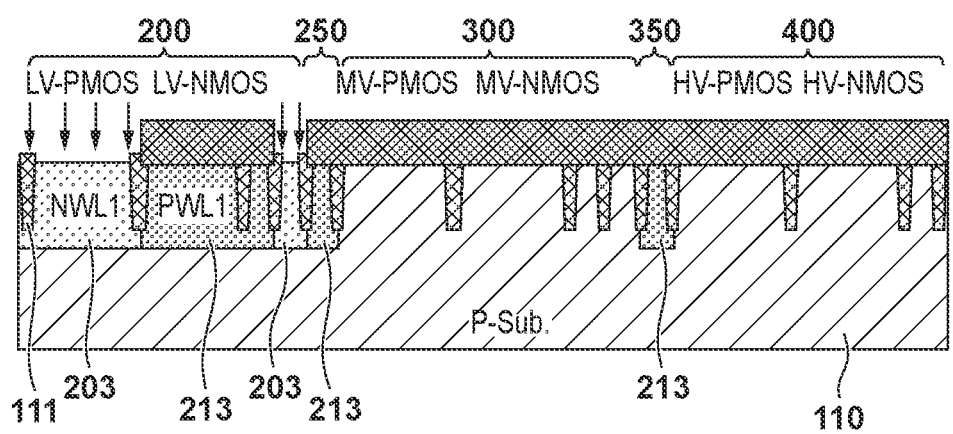

In the step shown in FIG. 12C, in a state in which predetermined regions are protected by a resist, an n-type first semiconductor region 203 is formed by multi-stage ion implantation. In the multi-stage ion implantation, for example, the acceleration energy can be adjusted within the range of 10 to 2,000 keV, and the dose amount can be adjusted within the range of 1e11 to 5e13/cm$^2$. The dose amount may be changed by the depth of multi-stage ion implantation. A high-concentration semiconductor region may be formed in a region shallower than the bottom portion of the STI 111, and a low-concentration semiconductor region may be formed in a region deeper than the bottom portion of the STI 111. The p-type first semiconductor region 213 and the n-type first semiconductor region 203 are adjacent semiconductor regions. For the adjacent regions, the conditions of ion implantation are set particularly such that the impurity concentrations in the p-type first semiconductor region 213 and the n-type first semiconductor region 203 become equal on the bottom portions of the STIs 111.

Figure 12D:
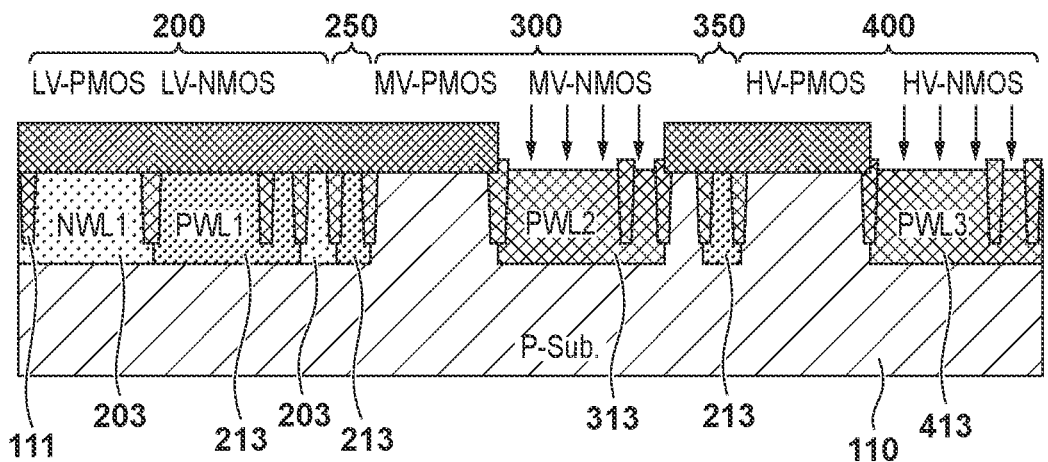

In the step shown in FIG. 12D, in a state in which predetermined regions are protected by a resist, a p-type second semiconductor region 313 and a p-type third semiconductor region 413 are formed by multi-stage ion implantation. In the multi-stage ion implantation, for example, the acceleration energy can be adjusted within the range of 10 to 3,000 keV, and the dose amount can be adjusted within the range of 1e11 to 5e13/cm$^2$. The dose amount may be changed by the depth of multi-stage ion implantation. A high-concentration semiconductor region may be formed in a region shallower than the bottom portion of the STI 111, and a low-concentration semiconductor region may be formed in a region deeper than the bottom portion of the STI 1. Note that the p-type second semiconductor region 313 and the p-type third semiconductor region 413 need not be formed using the same resist mask, as shown in FIG. 12D. Different masks may be used, and the ion implantation conditions may be changed.

Figure 12E:
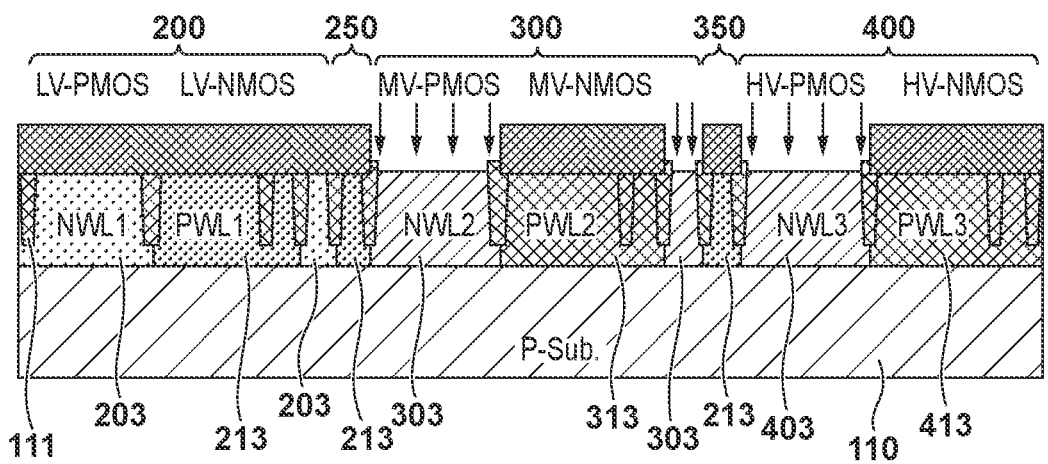

In the step shown in FIG. 12E, in a state in which predetermined regions are protected by a resist, an n-type second semiconductor region 303 is formed by multi-stage ion implantation. In the multi-stage ion implantation, for example, the acceleration energy can be adjusted within the range of 10 to 3,000 keV, and the dose amount can be adjusted within the range of 1e11 to 5e13/cm$^2$. The dose amount may be changed by the depth of multi-stage ion implantation. A high-concentration semiconductor region may be formed in a region shallower than the bottom portion of the STI 111, and a low-concentration semiconductor region may be formed in a region deeper than the bottom portion of the STI 111. The p-type second semiconductor region 313 and the n-type second semiconductor region 303, or the p-type third semiconductor region 413 and the n-type third semiconductor region 403 are semiconductor regions adjacent to each other. For the adjacent regions, the conditions of ion implantation can be set such that the impurity concentrations in the p-type second semiconductor region 313 and the n-type second semiconductor region 303 (NWL2) or in the p-type third semiconductor region 413 and the n-type third semiconductor region 403 become equal on the bottom portions of the STIs 111.

Figure 12F:
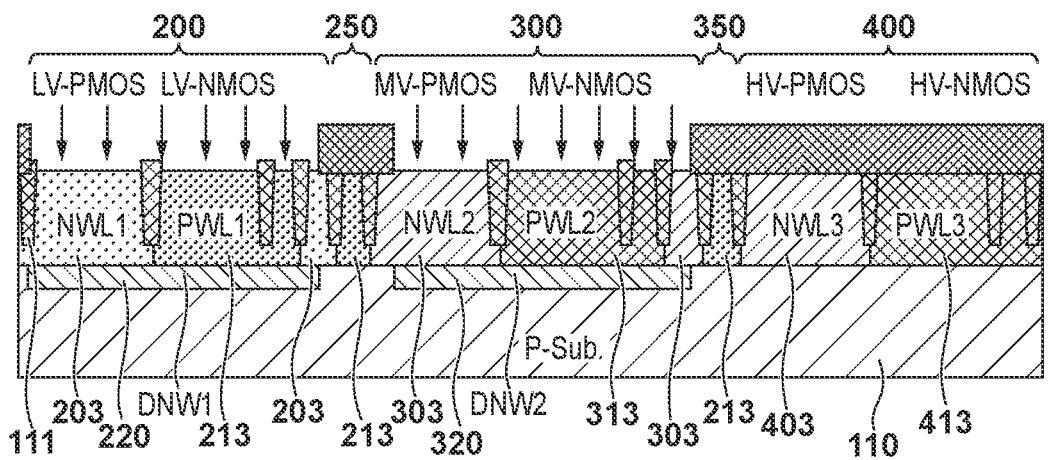

In the step shown in FIG. 12F, in a state in which predetermined regions are protected by a resist, an n-type first deep semiconductor region 220 and an n-type second deep semiconductor region 320 are formed by ion implantation. In the ion implantation, for example, the acceleration energy can be adjusted within the range of 10 to 4,000 keV, and the dose amount can be adjusted within the range of 5e11 to 1e14/cm$^2$. The n-type first deep semiconductor region 220 and the n-type second deep semiconductor region 320 need not be formed using the same resist mask. Different masks may be used, and the ion implantation conditions may be changed.

After the above-described steps shown in FIGS. 12B to 12F are executed, activation annealing for the ion-implanted dopants is sequentially executed. Note that the steps of FIGS. 12B to 12F need not always be executed in this order, and ion implantation may be executed in a reverse step order from FIG. 12F to FIG. 12B. In this case, when ion implantation of high acceleration is executed first, an amorphous layer is hardly formed on the surface of the device, and controllability of ion implantation improves. An example in which the LV-MV element isolation portion 250 and the MV-HV element isolation portion 350 are formed using the same mask as the p-type first semiconductor region 213 has been described. However, these may be formed using different masks or by sharing a mask.

As shown in FIG. 12G, in the subsequent step, a gate oxide film and a gate in each region of the semiconductor apparatus are formed, and after that, various kinds of n- and p-type light doping and ion implantation of HALO are executed. At this time, the film thickness of the gate oxide film, the gate length, and various kinds of ion implantation conditions may individually be changed in the regions of the low-voltage operation transistor 200, the medium-voltage operation transistor 300, and the high-voltage operation transistor 400. In the subsequent step, the side wall of each transistor of the semiconductor apparatus is formed. After the side wall is formed, silicide protection using an oxide film, which is configured to define a region of metal silicide, may be formed in each of the regions of the low-voltage operation transistor 200, the medium-voltage operation transistor 300, and the high-voltage operation transistor 400. Ion implantation in the source/drain regions is executed, and activation annealing and the like for the implanted dopants are sequentially executed, thereby forming the metal silicide. After that, contact plugs are formed, and multiple wiring layers and the like are formed.

The semiconductor apparatus need not always be formed in accordance with the above-described manufacturing method and step order, and replacement, change, and the like of various steps are possible. For example, after ion implantation in the source/drain of a transistor is executed, ion implantation in the semiconductor regions shown in FIGS. 12B to 12G may be executed. In this case, semiconductor regions of different depths can be formed via the polysilicon of the gates.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-087606, filed, May 19, 2020, which is hereby incorporated by reference herein in its entirety.

What is claimed is:

1. A semiconductor apparatus comprising:
   a first semiconductor region including a first surface and a second surface, in which a semiconductor of a first conductivity type is arranged;
   a second semiconductor region of the first conductivity type, which is arranged between the first surface and the second surface;
   a third semiconductor region of a second conductivity type, which is arranged in a region between the second semiconductor region and the second surface and on a side portion of the second semiconductor region;
   a fourth semiconductor region of the first conductivity type, which is arranged between the first surface and the second surface; and
   a fifth semiconductor region of the second conductivity type, which is arranged in a region between the fourth semiconductor region and the second surface and on a side portion of the fourth semiconductor region,
   wherein the third semiconductor region and the fifth semiconductor region are separated, and
   a net impurity concentration of the first conductivity type in each of the second semiconductor region and the fourth semiconductor region is lower than a net impurity concentration of the second conductivity type in each of a region of the third semiconductor region between the second semiconductor region and the second surface and a region of the fifth semiconductor region between the fourth semiconductor region and the second surface.

2. The apparatus according to claim 1, wherein the same potential is applied to the second semiconductor region and the fourth semiconductor region.

3. The apparatus according to claim 1, wherein a voltage applied between the second semiconductor region and the third semiconductor region and a voltage applied between the fourth semiconductor region and the fifth semiconductor region are different.

4. The apparatus according to claim 1, wherein the third semiconductor region and the fifth semiconductor region are arranged in regions of different impurity concentrations of the first conductivity type.

5. The apparatus according to claim 1, wherein a first transistor is arranged in the second semiconductor region, a second transistor is arranged in the third semiconductor region, a third transistor is arranged in the fourth semiconductor region, and a fourth transistor is arranged in the fifth semiconductor region.

6. The apparatus according to claim 5, wherein operation voltages of the first transistor and the third transistor are different.

7. The apparatus according to claim 1, wherein the third semiconductor region is neighbored on the fifth semiconductor region.

8. The apparatus according to claim 1, further including a sixth semiconductor region of the first conductivity type, which is adjacent to the third semiconductor region.

9. The apparatus according to claim 8, further including a seventh semiconductor region of the first conductivity type, which is adjacent to the fifth semiconductor region.

10. The apparatus according to claim 9, wherein the impurity concentration of the first conductivity type in the sixth semiconductor region is lower than the impurity concentration of the first conductivity type in the seventh semiconductor region.

11. The apparatus according to claim 1, wherein at least one electrode of a collector, an emitter, and a base of a bipolar transistor is arranged in a semiconductor region of the same impurity concentration as the second semiconductor region.

12. A semiconductor apparatus comprising:
    a first semiconductor region including a first surface and a second surface, in which a semiconductor of a first conductivity type is arranged;
    a second semiconductor region of the first conductivity type, which is arranged between the first surface and the second surface;
    a third semiconductor region of a second conductivity type, which is arranged in a region between the second semiconductor region and the second surface and on a side portion of the second semiconductor region;
    a fourth semiconductor region of the first conductivity type, which is arranged between the first surface and the second surface; and
    a fifth semiconductor region of the second conductivity type, which is arranged in a region between the fourth semiconductor region and the second surface and on a side portion of the fourth semiconductor region,
    wherein the third semiconductor region and the fifth semiconductor region are separated, and
    a net impurity concentration of the first conductivity type in the second semiconductor region is lower than a net impurity concentration of the first conductivity type in the fourth semiconductor region.

13. A manufacturing method of a semiconductor apparatus, comprising:
    preparing a semiconductor substrate including a first semiconductor region of a first conductivity type;
    implanting an impurity into a region of the semiconductor substrate where a second semiconductor region of the first conductivity type should be formed;
    implanting an impurity into a region of a side portion of the second semiconductor region where a third semiconductor region of a second conductivity type should be formed;

implanting an impurity into a region of the semiconductor substrate where a fourth semiconductor region of the first conductivity type should be formed;

implanting an impurity into a region of a side portion of the fourth semiconductor region where a fifth semiconductor region of the second conductivity type should be formed; and implanting an impurity into a region under the second semiconductor region and the fourth semiconductor region of the first conductivity type where a semiconductor region of the second conductivity type should be formed, wherein an impurity implantation condition is set such that a net impurity concentration of the first conductivity type in the second semiconductor region and the fourth semiconductor region becomes lower than a net impurity concentration of the second conductivity type in the semiconductor region of the second conductivity type under the second semiconductor region and the semiconductor region of the second conductivity type under the fourth semiconductor region.

14. The method according to claim 13, wherein the impurity implantation condition is set such that the net impurity concentration of the first conductivity type in the second semiconductor region becomes lower than the net impurity concentration of the first conductivity type in the fourth semiconductor region.

15. The method according to claim 13, wherein
a semiconductor region that becomes at least one electrode of a collector, an emitter, and a base of a bipolar transistor is formed when forming the second semiconductor region.

* * * * *